(12) United States Patent
Wu et al.

(10) Patent No.: US 11,529,591 B2
(45) Date of Patent: Dec. 20, 2022

(54) PLASMA SYSTEM AND METHOD OF MIXING PLASMA AND WATER MIST

(71) Applicant: NATIONAL CHIAO TUNG UNIVERSITY, Hsinchu (TW)

(72) Inventors: Jong-Shinn Wu, Hsinchu (TW);
Yun-Chien Cheng, Kaohsiung (TW);
Tsung-Rong Lin, Keelung (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 394 days.

(21) Appl. No.: 16/919,116

(22) Filed: Jul. 2, 2020

(65) Prior Publication Data
US 2021/0291123 A1 Sep. 23, 2021

(30) Foreign Application Priority Data
Mar. 17, 2020 (TW) .................................. 109108820

(51) Int. Cl.
*B01F 23/213* (2022.01)
*B01F 23/10* (2022.01)
*H01J 37/32* (2006.01)

(52) U.S. Cl.
CPC .......... *B01F 23/12* (2022.01); *H01J 37/3244* (2013.01)

(58) Field of Classification Search
CPC .............................. H01J 37/3244; B01F 23/12
USPC ........................................................ 261/19
See application file for complete search history.

(56) References Cited

U.S. PATENT DOCUMENTS

| 6,525,481 | B1 | 2/2003 | Masarykova | |
| 2019/0259583 | A1* | 8/2019 | Baba | ........................ H05H 1/46 |
| 2021/0023250 | A1* | 1/2021 | Golkowski | ............. A61L 2/202 |
| 2021/0327687 | A1* | 10/2021 | Choi | .................. H01J 37/32669 |
| 2022/0265879 | A1* | 8/2022 | Liu | ........................... A61L 2/14 |

FOREIGN PATENT DOCUMENTS

| CN | 109327954 A | 2/2019 |
| TW | I648465 B | 1/2019 |

OTHER PUBLICATIONS

J. Winter et al., "Feed gas humidity: a vital parameter affecting a cold atmospheric-pressure plasma jet and plasma-treated human skin cells", Journal of Physics D: Applied Physics, vol. 46, 2013.
Cheng Cheng et al., "Atmospheric pressure plasma jet utilizing Ar and Ar/H2O mixtures and its applications to bacteria inactivation", Chinese Physics B, vol. 23, No. 7, 2014.
Masakazu Tanino et al., "Sterilization using dielectric barrier discharge at atmospheric pressure", Fortieth IAS Annual Meeting Conference Record of the 2005 Industry Applications Conference, 2005, pp. 784-788.
Zdenko Machala et al., "Formation of ROS and RNS in Water Electro-Sprayed through Transient Spark Discharge in Air and their Bactericidal Effects", Plasma Processes and Polymers, vol. 10, pp. 649-659, 2013.

* cited by examiner

*Primary Examiner* — Christopher M Raabe
(74) *Attorney, Agent, or Firm* — CKC & Partners Co., LLC

(57) ABSTRACT

A plasma system is provided. The plasma system includes a low-temperature atmospheric-pressure plasma source and a water-mist supplying source. The low-temperature atmospheric-pressure plasma source has a nozzle. The nozzle is configured to eject a plasma. The water-mist supplying source is configured to deliver a water mist to the plasma ejected from the nozzle.

19 Claims, 8 Drawing Sheets

A-A

N-N

PLASMA SYSTEM AND METHOD OF MIXING PLASMA AND WATER MIST

RELATED APPLICATIONS

This application claims priority to Taiwanese Application Serial Number 109108820 filed Mar. 17, 2020, which is herein incorporated by reference.

BACKGROUND

Technical Field

The present disclosure relates to plasma systems and methods of mixing plasma and water mist.

Description of Related Art

At present, it is known that the use of atmospheric pressure cold plasma bundles is very wide. In practice, the atmospheric cold plasma beam can be used in different fields such as medical application, beauty, sterilization and various industries. Taking medical applications as an example, the atmospheric cold plasma beam can further be used for rapid hemostasis medical equipment, acute wound infection treatment medical equipment, chronic wound infection treatment medical equipment, cancer treatment equipment, sterilization equipment, surface cleaning and modification equipment, etc.

Technically speaking, one of the factors which affect the utilizing effect of the atmospheric cold plasma bundle is the content of the hydroxyl radicals in the atmospheric cold plasma bundle. In general, the higher the content of hydroxyl radicals in the atmospheric cold plasma bundle, the better the utilizing effect of the atmospheric cold plasma bundle can be. Therefore, how to effectively increase the content of hydroxyl radicals in the atmospheric cold plasma bundle is undoubtedly an important development direction of the industry.

SUMMARY

A technical aspect of the present disclosure is to provide a plasma system, which can increase the mixing effect of the water mist and the plasma. Thus, the plasma after mixing with the water mist can contain more hydroxyl radicals.

According to an embodiment of the present disclosure, a plasma system includes a low-temperature atmospheric-pressure plasma source and a water-mist supplying source. The low-temperature atmospheric-pressure plasma source has a nozzle. The nozzle is configured to eject a plasma. The water-mist supplying source is configured to deliver a water mist to the plasma ejected from the nozzle.

In one or more embodiments of the present disclosure, the plasma system further includes a mixer. The mixer is connected to the low-temperature atmospheric-pressure plasma source at least partially along a straight direction. The mixer has a chamber. The chamber is communicated with the nozzle. The nozzle is configured to eject the plasma along the straight direction. The water-mist supplying source is connected with the mixer and configured to deliver the water mist to the chamber.

In one or more embodiments of the present disclosure, the mixer includes a top plate, a base plate, a side wall and at least one connecting tube. The top plate has a first opening. The nozzle at least partially penetrates through the first opening. The base plate has a second opening. The second opening aligns with the first opening along the straight direction. The chamber communicates between the first opening and the second opening. The side wall is connected between the top plate and the base plate. An inner wall surface of the side wall surrounds and defines the chamber. A projection of the inner wall surface is of a circular shape along the straight direction. The side wall has at least one third opening. The third opening has an extension direction as projected along the straight direction. The extension direction is deviated from a center surrounded by the projection of the inner wall surface along the straight direction. The connecting tube is disposed outside the side wall and aligned with the third opening. The connecting tube extends along the extension direction and is configured to connect with the water-mist supplying source.

In one or more embodiments of the present disclosure, the mixer includes a plate body, at least one connecting tube and a hollow conical body. The plate body has a fourth opening and at least one fifth opening. The nozzle at least partially penetrates through the fourth opening. The fifth opening has an extension direction. A projection of the extension direction along the straight direction is deviated from the fourth opening. The connecting tube is disposed on the plate body and aligned with the fifth opening. The connecting tube extends along the extension direction and is configured to connect with the water-mist supplying source. The hollow conical body is connected with a side of the plate body away from the connecting tube. An inner wall surface of the hollow conical body defines the chamber. A projection of the inner wall surface is at least partially of a circular shape along the straight direction. An end of the hollow conical body away from the connecting tube defines a sixth opening. The sixth opening aligns with the fourth opening along the straight direction. A center surrounded by the projection of the inner wall surface along the straight direction is located between the fourth opening and the sixth opening. The chamber gradually decreases towards the sixth opening.

In one or more embodiments of the present disclosure, the extension direction is inclined to the plate body.

In one or more embodiments of the present disclosure, the plasma system further includes a first working gas supplying source. The first working gas supplying source is connected with the low-temperature atmospheric-pressure plasma source. The first working gas supplying source is configured to supply a first working gas to the low-temperature atmospheric-pressure plasma source for the low-temperature atmospheric-pressure plasma source to produce the plasma.

In one or more embodiments of the present disclosure, the first working gas is argon, helium, nitrogen, oxygen, hydrogen or air.

In one or more embodiments of the present disclosure, a range of a flow rate of the first working gas is between 1 standard liter per minute and 30 standard liter per minute.

In one or more embodiments of the present disclosure, the plasma system further includes a second working gas supplying source. The second working gas supplying source is connected with the water-mist supplying source. The second working gas supplying source is configured to supply a second working gas to drive the water mist.

In one or more embodiments of the present disclosure, a range of a flow rate of the second working gas is between 0 standard liter per minute and 30 standard liter per minute.

In one or more embodiments of the present disclosure, a range of a flow rate of the water mist is between 1 milligram per standard liter per minute and 300 milligram per standard liter per minute.

Another technical aspect of the present disclosure is to provide a method of mixing plasma and water mist, which can increase the mixing effect of the water mist and the plasma. Thus, the plasma after mixing with the water mist can contain more hydroxyl radicals.

According to an embodiment of the present disclosure, a method of mixing plasma and water mist includes converting a first working gas to a plasma by a low-temperature atmospheric-pressure plasma source and ejecting the plasma towards an ejection zone of the low-temperature atmospheric-pressure plasma source; and mixing the plasma ejected with a water mist at the ejection zone.

In one or more embodiments of the present disclosure, the procedure of mixing the plasma ejected with the water mist includes injecting the water mist into a chamber; ejecting the plasma towards the chamber along a straight direction; and ejecting a mixture of the plasma and the water mist out of the chamber along the straight direction after mixing of the plasma and the water mist inside the chamber.

In one or more embodiments of the present disclosure, the procedure of injecting the water mist includes ejecting the water mist inside the chamber in a direction deviated from a center of the chamber on a projection at least partially along the straight direction. The procedure of ejecting the plasma towards the chamber includes ejecting the plasma towards the center of the chamber.

In one or more embodiments of the present disclosure, a range of a flow rate of the water mist is between 1 milligram per standard liter per minute and 300 milligram per standard liter per minute.

In one or more embodiments of the present disclosure, the procedure of injecting the water mist includes driving the water mist to the chamber by a second working gas.

In one or more embodiments of the present disclosure, a range of a flow rate of the second working gas is between 0 standard liter per minute and 30 standard liter per minute.

In one or more embodiments of the present disclosure, the first working gas is argon, helium, nitrogen, oxygen, hydrogen or air.

In one or more embodiments of the present disclosure, a range of a flow rate of the first working gas is between 1 standard liter per minute and 30 standard liter per minute.

When compared with the prior art, the above-mentioned embodiments of the present disclosure have at least the following advantages:

(1) Since the extension direction of the connecting tube and the third opening is deviated from the center surrounded by the projection of the inner wall surface of the side wall along the straight direction, when the water mist passes through the connecting tube and the third opening to enter into the chamber of the mixer, the water mist will form a vortex inside the chamber of the mixer, facilitating the mixing with the plasma.

(2) Since the plasma ejected can pass through a center of the vortex formed by the water mist, a more effective mixing with the water mist can be carried out. Thus, the plasma after mixing can contain more hydroxyl radicals.

(3) Under the condition that the range of the flow rate of the water mist is between 1 milligram per standard liter per minute and 300 milligram per standard liter per minute, the water mist will not weaken the strength of the plasma nor even extinguish the plasma. Moreover, the water droplets of the water mist can reach a suitable size. To be specific, the particle size of the water droplets of the water mist will not be too small. Thus, the water droplets of the water mist are uneasy to be evaporated to disappear. On the contrary, the particle size of the water droplets of the water mist will not be too big. Thus, the mixing effect with the plasma will not be affected as a result of an increase in the overall surface area of the water mist.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
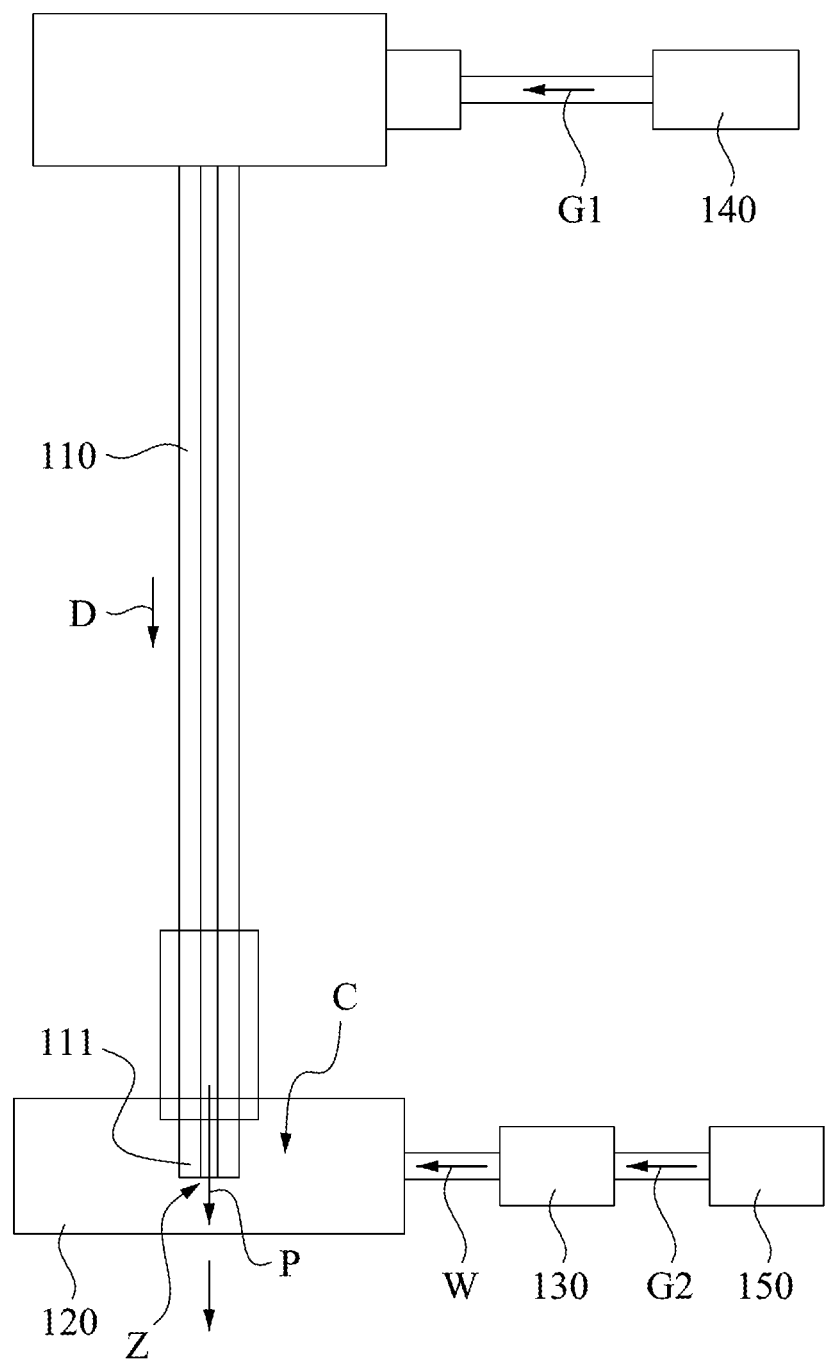
FIG. 1 is a schematic view of a plasma system according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference is made to FIG. 1. FIG. 1 is a schematic view of a plasma system 100 according to an embodiment of the present disclosure. In this embodiment, as shown in FIG. 1, a plasma system 100 includes a low-temperature atmospheric-pressure plasma source 110, a mixer 120 and a water-mist supplying source 130. The low-temperature atmospheric-pressure plasma source 110 has a nozzle 111. The nozzle 111 of the low-temperature atmospheric-pressure plasma source 110 is configured to eject a plasma P along a straight direction D. The space outside the nozzle 111 defines an ejection zone Z. In this embodiment, the plasma P is atmospheric cold plasma, and the range of temperature of the plasma P is between 20 degree Celsius and 60 degree Celsius. However, this range of temperature does not intend to limit the present disclosure. The mixer 120 is connected to the low-temperature atmospheric-pressure plasma source 110 at least partially along the straight direction D. The mixer 120 has a chamber C. The chamber C of the mixer 120 is communicated with the nozzle 111 of the low-temperature atmospheric-pressure plasma source 110, such that the nozzle 111 ejects the plasma P to the chamber C of the mixer 120 along the straight direction D, and the ejection zone Z is located inside the chamber C of the mixer 120. The water-mist supplying source 130 is connected with the mixer 120, and is configured to deliver a water mist W to the chamber C of the mixer 120. To be specific, the water mist W is a fog with plenty of water droplets. For the sake of simplification of the drawings, in FIG. 1, the mixer 120 is presented in a simplified form. For the practical structure of the mixer 120 in practical applications, please refer to FIGS. 2-7. However, it should be noted that the mixer 120 is not an essential element. According to the actual situation, the user can operate the plasma system 100 with the mixer 120 being removed. However, this does not intend to limit the present disclosure.

In practical applications, the plasma system 100 further includes a first working gas supplying source 140. The first working gas supplying source 140 is connected with the low-temperature atmospheric-pressure plasma source 110. The first working gas supplying source 140 is configured to supply a first working gas G1 to the low-temperature atmospheric-pressure plasma source 110 for the low-temperature atmospheric-pressure plasma source 110 to produce the plasma P. Afterwards, the plasma P is ejected from the nozzle 111 to the chamber C of the mixer 120. For example, the first working gas G1 can be argon, helium, nitrogen, oxygen, hydrogen or air. However, this does not intend to limit the present disclosure.

Moreover, the plasma system 100 further includes a second working gas supplying source 150. The second working gas supplying source 150 is connected with the water-mist supplying source 130. The second working gas supplying source 150 is configured to supply a second working gas G2 to drive the water mist W to inject into the chamber C of the mixer 120, such that the water mist W is mixed at the ejection zone Z with the plasma P ejected from the nozzle 111. A mixture of the plasma P and the water mist W is ejected out of the mixer 120 along the straight direction D after mixing of the plasma P and the water mist W at the ejection zone Z.

Figure 2:
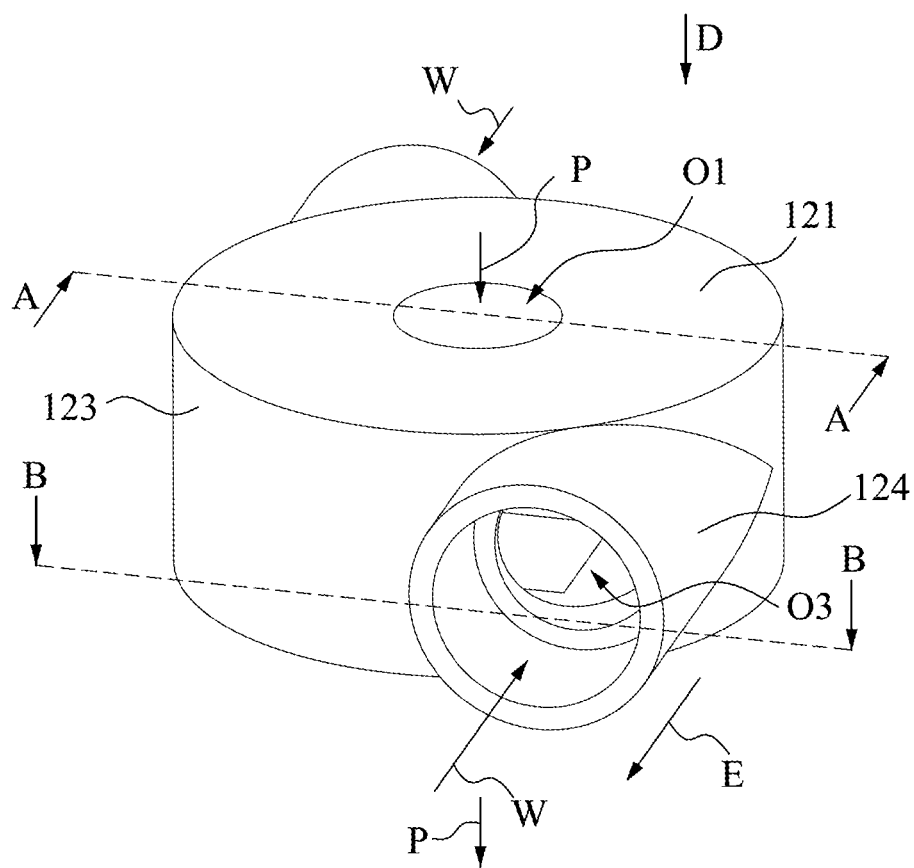
FIG. 2 is a schematic view of a mixer according to an embodiment of the present disclosure.
Figure 3:
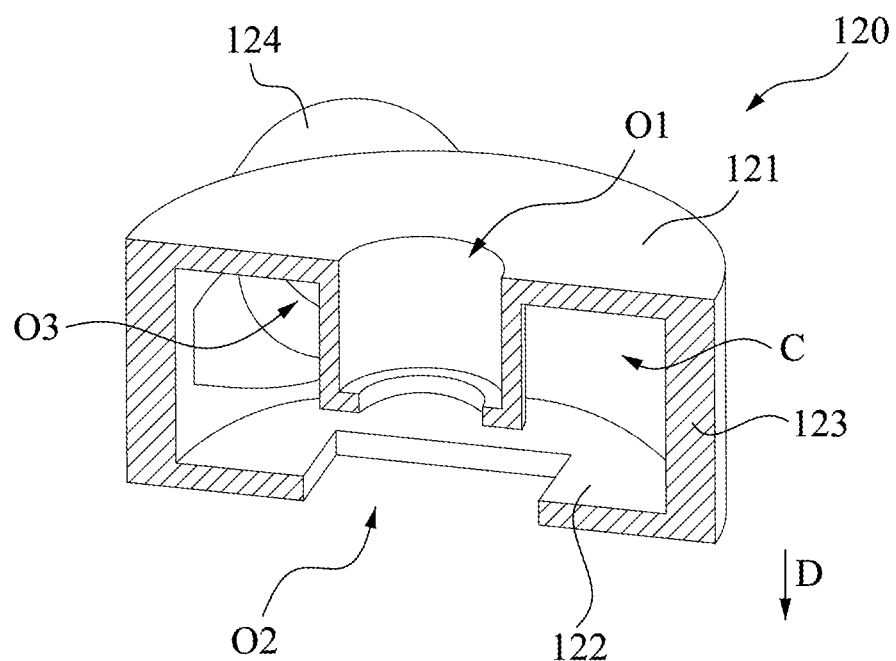
FIG. 3 is a cross-sectional view along the section line A-A of FIG. 2.
Figure 4:
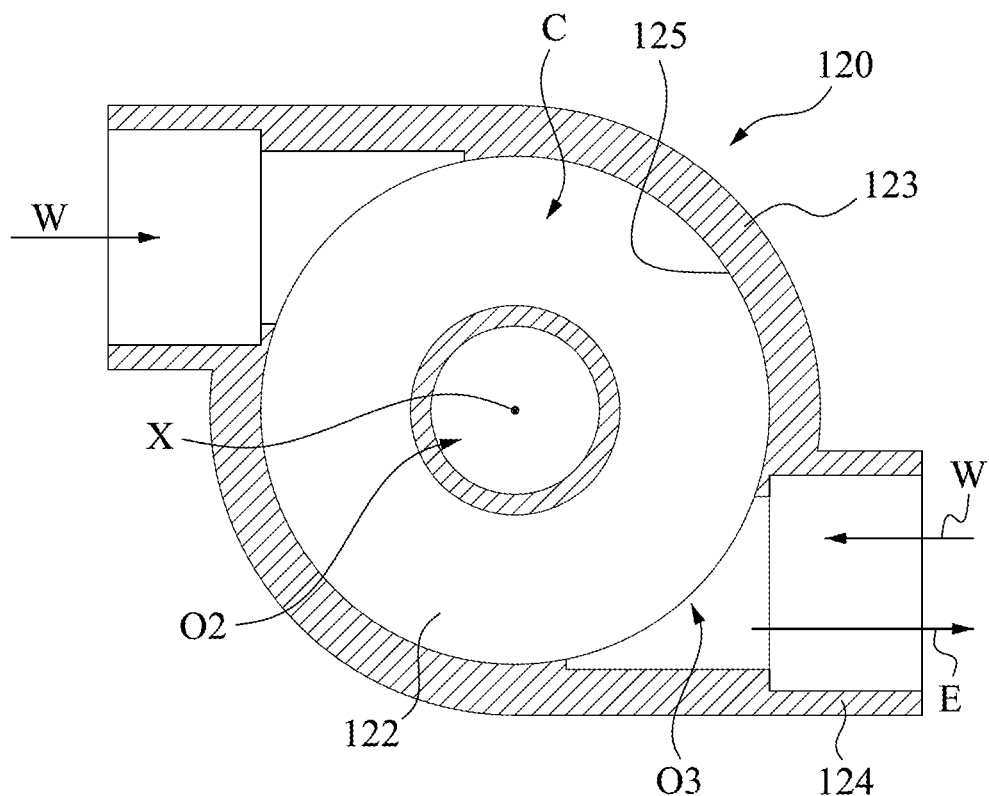
FIG. 4 is a cross-sectional view along the section line B-B of FIG. 2.

Reference is made to FIGS. 2-4. FIG. 2 is a schematic view of a mixer 120 according to an embodiment of the present disclosure. FIG. 3 is a cross-sectional view along the section line A-A of FIG. 2. FIG. 4 is a cross-sectional view along the section line B-B of FIG. 2. In this embodiment, as shown in FIGS. 2-4, the mixer 120 includes a top plate 121, a base plate 122, a side wall 123 and at least one connecting tube 124. The top plate 121 has a first opening O1. The nozzle 111 (please refer to FIG. 1) of the low-temperature atmospheric-pressure plasma source 110 at least partially penetrates through the first opening O1 of the top plate 121, such that the ejection zone Z (please refer to FIG. 1) is located inside the mixer 120. The base plate 122 has a second opening O2. The second opening O2 of the base plate 122 aligns with the first opening O1 of the top plate 121 along the straight direction D. The chamber C communicates between the first opening O1 of the top plate 121 and the second opening O2 of the base plate 122. The side wall 123 is connected between the top plate 121 and the base plate 122. An inner wall surface 125 of the side wall 123 surrounds and defines the chamber C. A projection of the inner wall surface 125 is of a circular shape along the straight direction D, as shown in FIG. 4.

It is worth to note that, the side wall 123 has at least one third opening O3. In this embodiment, as shown in FIGS. 2 and 4, the side wall 123 has two of the third openings O3. In other embodiments, the side wall 123 may have more numbers of the third openings O3. However, this does not intend to limit the present disclosure. The third opening O3 of the side wall 123 has an extension direction E as projected along the straight direction D. The extension direction E of the third opening O3 is deviated from a center X surrounded by the projection of the inner wall surface 125 of the side wall 123 along the straight direction D. The connecting tube 124 is disposed outside the side wall 123 and is aligned with the third opening O3. The connecting tube 124 extends along the extension direction E. The connecting tube 124 is configured to connect with the water-mist supplying source 130 (please refer to FIG. 1), so as to allow the water mist W to pass through and enter into the chamber C of the mixer 120. As mentioned above, since the extension direction E of the connecting tube 124 and the third opening O3 is deviated from the center X surrounded by the projection of the inner wall surface 125 of the side wall 123 along the straight direction D, when the water mist W passes through the connecting tube 124 and the third opening O3 to enter into the chamber C of the mixer 120, the water mist W will form a vortex inside the chamber C of the mixer 120, facilitating the mixing with the plasma P.

To be specific, as shown in FIG. 1, during the operation of the plasma system 100, the first working gas supplying source 140 supplies the first working gas G1 to the low-temperature atmospheric-pressure plasma source 110 for the low-temperature atmospheric-pressure plasma source 110 to produce the plasma P. Afterwards, the plasma P is ejected from the nozzle 111 of the low-temperature atmospheric-pressure plasma source 110 along the straight direction D to the ejection zone Z located inside the chamber C through the first opening O1 of the mixer 120. In practical applications, a range of a flow rate of the first working gas G1 as supplied to the low-temperature atmospheric-pressure plasma source 110 is between 1 standard liter per minute (1 slm) and 30 standard liter per minute (30 slm). However, this does not intend to limit the present disclosure.

On the other hand, as shown in FIG. 1, during the operation of the plasma system 100, the second working gas supplying source 150 supplies the second working gas G2 to drive the water mist W from the water-mist supplying source 130 to inject into the chamber C of the mixer 120. After the water mist W is injected into the chamber C of the mixer 120, as mentioned above, the water mist W forms a vortex inside the chamber C of the mixer 120, facilitating the mixing of the water mist W and the plasma P inside the chamber C. The plasma P after mixing with the water mist W inside the chamber C of the mixer 120 is ejected out of the mixer 120 along the straight direction D from the second opening O2 of the base plate 122. Since the water mist W contains water, the plasma P mixed with the water mist W contains hydroxyl radicals. The plasma P containing plenty of hydroxyl radicals can be applied but not limited to different fields such as medical application, beauty, sterilization and various industries. For example, the plasma P containing plenty of hydroxyl radicals can be used to carry out applications such as sterilization, wound healing promotion, cancer treatment or surface modification without being harmful to the organism. However, these applications do not intend to limit the present disclosure.

In practical applications, a range of a flow rate of the second working gas G2 as supplied to the water-mist supplying source 130 is between 0 standard liter per minute (0 slm) and 30 standard liter per minute (30 slm), and a range of a flow rate of the water mist W as injected into the chamber C of the mixer 120 is between 1 milligram per standard liter per minute (1 mg/slm) and 300 milligram per standard liter per minute (300 mg/slm). However, this does not intend to limit the present disclosure. Under the condition that the range of the flow rate of the water mist W is between 1 milligram per standard liter per minute and 300 milligram per standard liter per minute, the water mist W will not weaken the strength of the plasma P nor even extinguish the plasma P. Moreover, the water droplets of the water mist W can reach a suitable size. To be specific, the particle size of the water droplets of the water mist W will not be too small. Thus, the water droplets of the water mist W are uneasy to be evaporated to disappear. On the contrary, the particle size of the water droplets of the water mist W will not be too big. Thus, the mixing effect with the plasma P will not be affected as a result of an increase in the overall surface area of the water mist W.

In addition, the second working gas G2 can be substantially the same as the first working gas G1, which means the second working gas G2 can also be argon, helium, nitrogen, oxygen, hydrogen or air. However, this does not intend to limit the present disclosure. It is worth to note that, using the second working gas G2 which is the same as the first working gas G1 to drive the water mist W, such that the water mist W and the plasma P are mixed inside the chamber C of the mixer 120, can effectively increase the amount of hydroxyl radicals produced in the plasma P.

Figure 5:
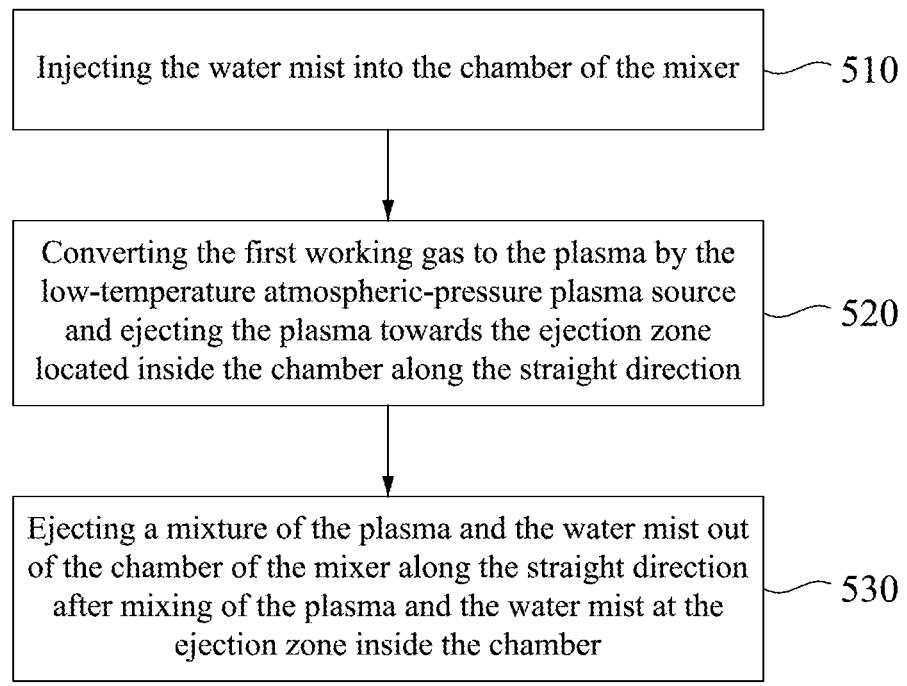
FIG. 5 is a flow diagram of a method of mixing plasma and water mist according to an embodiment of the present disclosure.

In addition, reference is made to FIG. 5. FIG. 5 is a flow diagram of a method 500 of mixing plasma P and water mist W according to an embodiment of the present disclosure. Apart from the plasma system 100 as mentioned above, another aspect of the present disclosure provides a method 500 of mixing plasma P and water mist W. In this embodiment, as shown in FIG. 5, the mixing method 500 includes the following procedures (it should be noted that the sequence of the procedures and the subsidiary procedures as mentioned below, unless otherwise specified, can all be adjusted upon the actual needs, or even executed at the same time or partially at the same time):

(1) Injecting the water mist W into the chamber C of the mixer 120 (Procedure 510).

(2) Converting the first working gas G1 to the plasma P by the low-temperature atmospheric-pressure plasma source 110 and ejecting the plasma P towards the ejection zone Z located inside the chamber C along the straight direction D (Procedure 520).

(3) Ejecting a mixture of the plasma P and the water mist W out of the chamber C of the mixer 120 along the straight direction D after mixing of the plasma P and the water mist W at the ejection zone Z inside the chamber C (Procedure 530).

It should be noted that, as mentioned above, the mixer 120 is not an essential element. According to the actual situation, the user can use the mixing method 500 with the mixer 120 being removed. However, this does not intend to limit the present disclosure.

To be specific, in the Procedure 510, the water mist W is injected into the chamber C of the mixer 120 as driven by the second working gas G2. Moreover, a projection of the direction in which the water mist W is injected into the chamber C of the mixer 120 at least partially along the straight direction D is deviated from a center of the chamber C, which is the center X as mentioned above. In this way, the water mist W forms a vortex inside the chamber C. Correspondingly, in the Procedure 520, the plasma P as converted is ejected towards the center of the chamber C, which is the center X as mentioned above. In this way, the plasma P ejected can pass through a center of the vortex formed by the water mist W, such that a more effective mixing with the water mist W can be carried out. Thus, the plasma P after mixing can contain more hydroxyl radicals.

Figure 6:
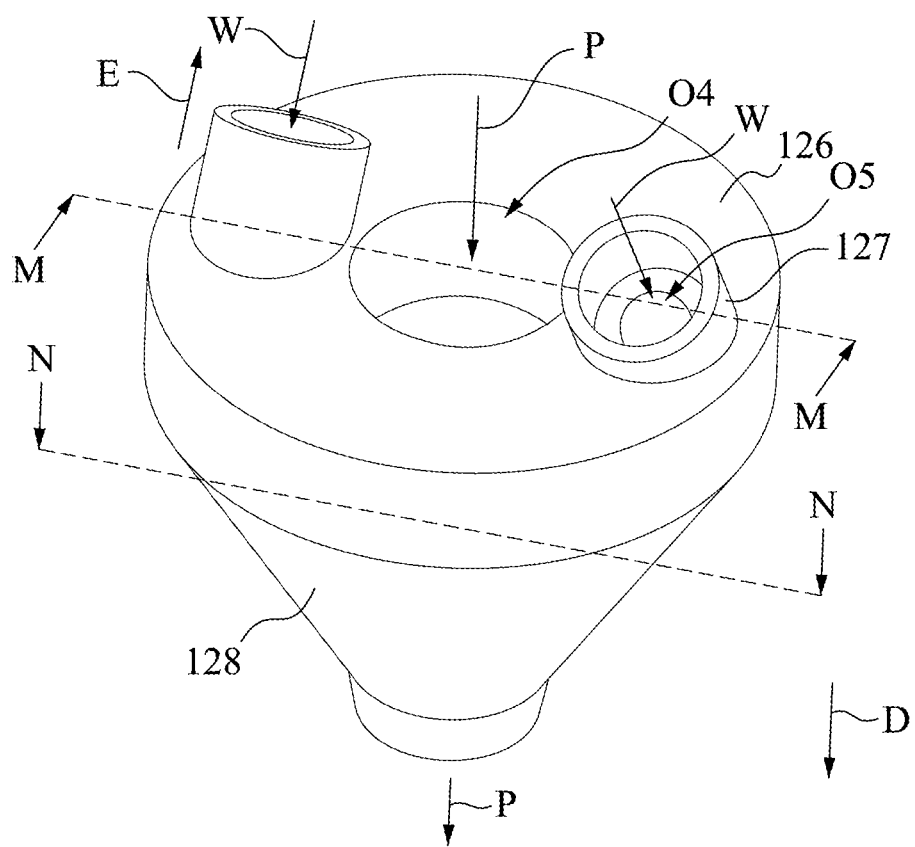
FIG. 6 is a schematic view of a mixer according to another embodiment of the present disclosure.
Figure 7:
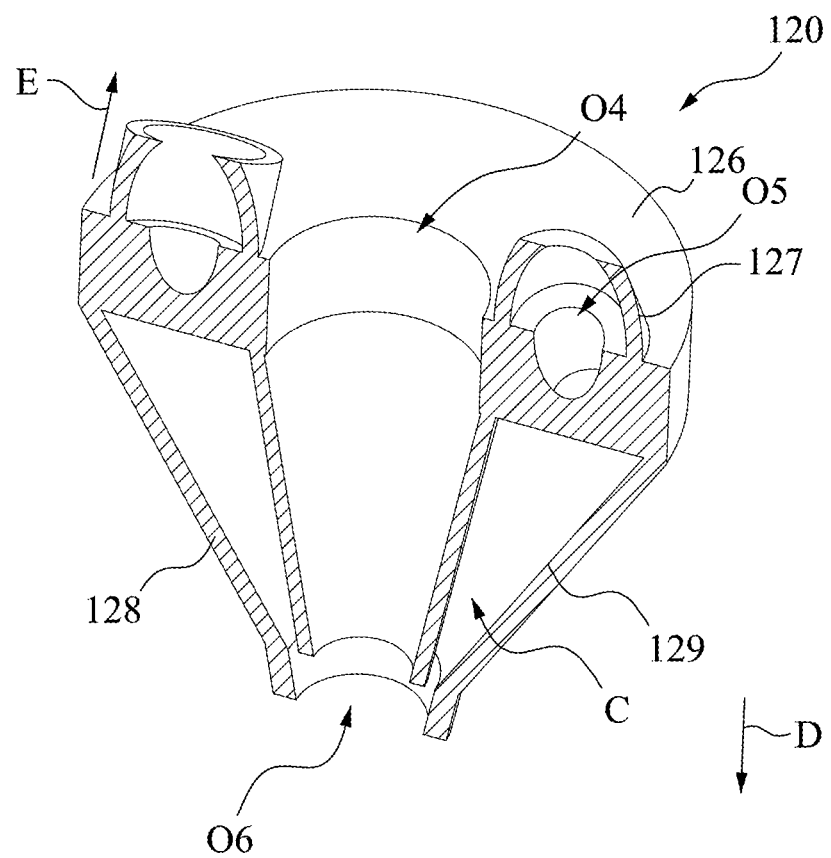
FIG. 7 is a cross-sectional view along the section line M-M of FIG. 6.
Figure 8:
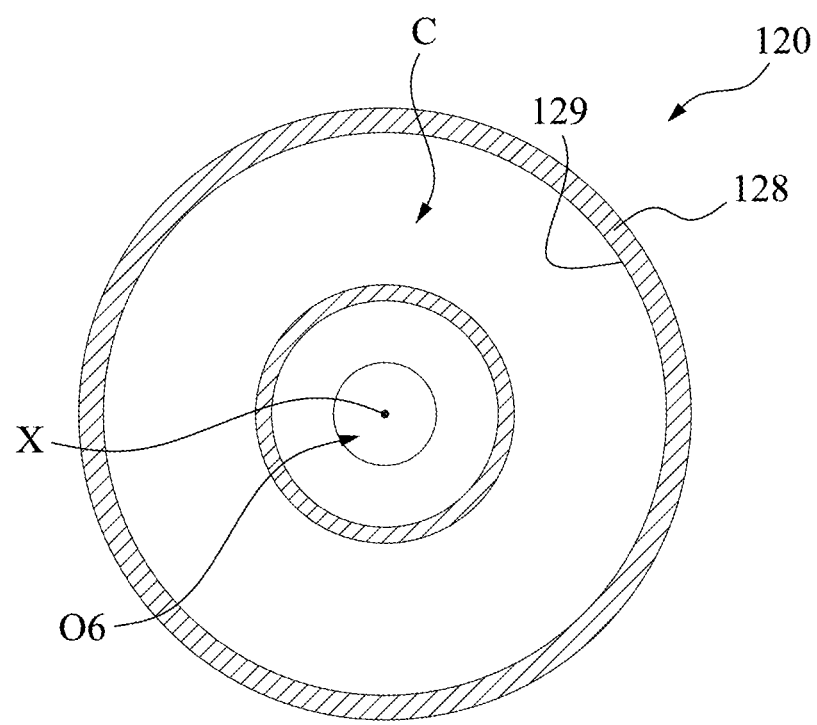
FIG. 8 is a cross-sectional view along the section line N-N of FIG. 6.

Moreover, reference is made to FIGS. 6-8. FIG. 6 is a schematic view of a mixer 120 according to another embodiment of the present disclosure. FIG. 7 is a cross-sectional view along the section line M-M of FIG. 6. FIG. 8 is a cross-sectional view along the section line N-N of FIG. 6. In this embodiment, as shown in FIGS. 6-8, the mixer 120 includes a plate body 126, at least one connecting tube 127 and a hollow conical body 128. The plate body 126 has a fourth opening O4 and at least one fifth opening O5. In this embodiment, as shown in FIGS. 6-7, the plate body 126 has two of the fifth openings O5. In other embodiments, the plate body 126 may have more numbers of the fifth openings O5. However, this does not intend to limit the present disclosure. The nozzle 111 (please refer to FIG. 1) of the low-temperature atmospheric-pressure plasma source 110 at least partially penetrates through the fourth opening O4 of the plate body 126, such that the ejection zone Z (please refer to FIG. 1) is located inside the mixer 120. The fifth opening O5 of the plate body 126 has an extension direction E. A projection of the extension direction E of the fifth opening O5 along the straight direction D is deviated from the fourth opening O4 of the plate body 126. The connecting tube 127 is disposed on the plate body 126 and aligned with the fifth opening O5. The connecting tube 127 extends along the extension direction E and is configured to connect with the water-mist supplying source 130 (please refer to FIG. 1), so as to allow the water mist W to pass through and enter into the chamber C of the mixer 120. The hollow conical body 128 is connected with a side of the plate body 126 away from the connecting tube 127. An inner wall surface 129 of the hollow conical body 128 defines the chamber C. A projection of the inner wall surface 129 is at least partially of a circular shape along the straight direction D, as shown in FIG. 8. Moreover, an end of the hollow conical body 128 away from the connecting tube 127 defines a sixth opening O6. The sixth opening O6 of the hollow conical body 128 aligns with the fourth opening O4 of the plate body 126 along the straight direction D. A center X surrounded by the projection of the inner wall surface 129 of the hollow conical body 128 along the straight direction D is located between the fourth opening O4 of the plate body 126 and the sixth opening O6 of the hollow conical body 128. The chamber C gradually decreases towards the sixth opening O6 of the hollow conical body 128.

As mentioned above, since the extension direction E of the connecting tube 127 and the fifth opening O5 is deviated from the fourth opening O4, which is also deviated from the projection of the center X along the straight direction D, when the water mist W passes through the connecting tube 127 and the fifth opening O5 to enter into the chamber C of the mixer 120, the water mist W will form a vortex inside the chamber C of the mixer 120, facilitating the mixing with the plasma P. The plasma P after mixing with the water mist W inside the chamber C of the mixer 120 is ejected out of the mixer 120 along the straight direction D from the sixth opening O6 of the hollow conical body 128.

Moreover, in this embodiment, as shown in FIGS. 6-7, the extension direction E is inclined to the plate body 126, which means the connecting tube 127 is inclined to the plate body 126. In this way, when the water mist W passes through the connecting tube 127 and the fifth opening O5 to enter into the chamber C of the mixer 120, the water mist W will form a three-dimensional vortex inside the chamber C of the mixer 120, facilitating the mixing with the plasma P.

In conclusion, when compared with the prior art, the aforementioned embodiments of the present disclosure have at least the following advantages:

(1) Since the extension direction of the connecting tube and the third opening is deviated from the center surrounded by the projection of the inner wall surface of the side wall along the straight direction, when the water mist passes through the connecting tube and the third opening to enter into the chamber of the mixer, the water mist will form a vortex inside the chamber of the mixer, facilitating the mixing with the plasma.

(2) Since the plasma ejected can pass through a center of the vortex formed by the water mist, a more effective mixing with the water mist can be carried out. Thus, the plasma after mixing can contain more hydroxyl radicals.

(3) Under the condition that the range of the flow rate of the water mist is between 1 milligram per standard liter per minute and 300 milligram per standard liter per minute, the water mist will not weaken the strength of the plasma nor even extinguish the plasma. Moreover, the water droplets of the water mist can reach a suitable size. To be specific, the particle size of the water droplets of the water mist will not be too small. Thus, the water droplets of the water mist are uneasy to be evaporated to disappear. On the contrary, the particle size of the water droplets of the water mist will not be too big. Thus, the mixing effect with the plasma will not be affected as a result of an increase in the overall surface area of the water mist.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A plasma system, comprising:
   a low-temperature atmospheric-pressure plasma source having a nozzle configured to eject a plasma; and
   a water-mist supplying source configured to deliver a water mist to the plasma ejected from the nozzle.

2. The plasma system of claim 1, further comprising:
   a mixer connected to the low-temperature atmospheric-pressure plasma source at least partially along a straight direction, the mixer having a chamber communicated with the nozzle, the nozzle being configured to eject the plasma along the straight direction, the water-mist supplying source being connected with the mixer and configured to deliver the water mist to the chamber.

3. The plasma system of claim 2, wherein the mixer comprises:
   a top plate having a first opening, the nozzle at least partially penetrates through the first opening;
   a base plate having a second opening aligning with the first opening along the straight direction, the chamber communicates between the first opening and the second opening;
   a side wall connected between the top plate and the base plate, an inner wall surface of the side wall surrounds and defines the chamber, a projection of the inner wall surface is of a circular shape along the straight direction, the side wall has at least one third opening having an extension direction as projected along the straight direction, the extension direction is deviated from a center surrounded by the projection of the inner wall surface along the straight direction; and
   at least one connecting tube disposed outside the side wall and aligned with the third opening, the connecting tube extends along the extension direction and is configured to connect with the water-mist supplying source.

4. The plasma system of claim 2, wherein the mixer comprises:
   a plate body having a fourth opening and at least one fifth opening, the nozzle at least partially penetrates through the fourth opening, the fifth opening has an extension direction, a projection of the extension direction along the straight direction is deviated from the fourth opening;
   at least one connecting tube disposed on the plate body and aligned with the fifth opening, the connecting tube extends along the extension direction and is configured to connect with the water-mist supplying source; and
   a hollow conical body connected with a side of the plate body away from the connecting tube, an inner wall surface of the hollow conical body defines the chamber, a projection of the inner wall surface is at least partially of a circular shape along the straight direction, an end of the hollow conical body away from the connecting tube defines a sixth opening aligning with the fourth opening along the straight direction, a center surrounded by the projection of the inner wall surface along the straight direction is located between the fourth opening and the sixth opening, the chamber gradually decreases towards the sixth opening.

5. The plasma system of claim 4, wherein the extension direction is inclined to the plate body.

6. The plasma system of claim 1, further comprising:
   a first working gas supplying source connected with the low-temperature atmospheric-pressure plasma source and configured to supply a first working gas to the low-temperature atmospheric-pressure plasma source for the low-temperature atmospheric-pressure plasma source to produce the plasma.

7. The plasma system of claim 6, wherein the first working gas is argon, helium, nitrogen, oxygen, hydrogen or air.

8. The plasma system of claim 6, wherein a range of a flow rate of the first working gas is between 1 standard liter per minute and 30 standard liter per minute.

9. The plasma system of claim 1, further comprising:
   a second working gas supplying source connected with the water-mist supplying source and configured to supply a second working gas to drive the water mist.

10. The plasma system of claim 9, wherein a range of a flow rate of the second working gas is between 0 standard liter per minute and 30 standard liter per minute.

11. The plasma system of claim 1, wherein a range of a flow rate of the water mist is between 1 milligram per standard liter per minute and 300 milligram per standard liter per minute.

12. A method of mixing plasma and water mist, comprising:
   converting a first working gas to a plasma by a low-temperature atmospheric-pressure plasma source and ejecting the plasma towards an ejection zone of the low-temperature atmospheric-pressure plasma source; and mixing the plasma ejected with a water mist at the ejection zone.

13. The method of claim 12, wherein mixing the plasma ejected with the water mist comprises:
    injecting the water mist into a chamber;
    ejecting the plasma towards the chamber along a straight direction; and
    ejecting a mixture of the plasma and the water mist out of the chamber along the straight direction after mixing of the plasma and the water mist inside the chamber.

14. The method of claim 13, wherein injecting the water mist comprises:
    ejecting the water mist inside the chamber in a direction deviated from a center of the chamber on a projection at least partially along the straight direction; and ejecting the plasma towards the chamber comprises:
    ejecting the plasma towards the center of the chamber.

15. The method of claim 13, wherein a range of a flow rate of the water mist is between 1 milligram per standard liter per minute and 300 milligram per standard liter per minute.

16. The method of claim 13, wherein injecting the water mist comprises:
    driving the water mist to the chamber by a second working gas.

17. The method of claim 16, wherein a range of a flow rate of the second working gas is between 0 standard liter per minute and 30 standard liter per minute.

18. The method of claim 12, wherein the first working gas is argon, helium, nitrogen, oxygen, hydrogen or air.

19. The method of claim 12, wherein a range of a flow rate of the first working gas is between 1 standard liter per minute and 30 standard liter per minute.

* * * * *